US010297416B2

(12) United States Patent
Agemura et al.

(10) Patent No.: US 10,297,416 B2
(45) Date of Patent: May 21, 2019

(54) SCANNING ELECTRON MICROSCOPE

(71) Applicant: Hitachi High-Technologies Corporation, Minato-ku, Tokyo (JP)

(72) Inventors: Toshihide Agemura, Tokyo (JP); Masashi Sasaki, Tokyo (JP); Daisuke Kobayashi, Tokyo (JP); Shunsuke Sato, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 15/513,695

(22) PCT Filed: Oct. 20, 2014

(86) PCT No.: PCT/JP2014/077811
§ 371 (c)(1),
(2) Date: Mar. 23, 2017

(87) PCT Pub. No.: WO2016/063325
PCT Pub. Date: Apr. 28, 2016

(65) Prior Publication Data
US 2017/0309437 A1 Oct. 26, 2017

(51) Int. Cl.
*H01J 37/073* (2006.01)
*H01J 37/28* (2006.01)
*H01J 37/18* (2006.01)

(52) U.S. Cl.
CPC ............ *H01J 37/073* (2013.01); *H01J 37/18* (2013.01); *H01J 37/28* (2013.01);
(Continued)

(58) Field of Classification Search
CPC .... H01J 37/073; H01J 37/18; H01J 37/06341; H01J 37/28; H01J 2237/06341; H01J 2237/022; H01J 2237/1825
See application file for complete search history.

(56) References Cited

U.S. PATENT DOCUMENTS 3,872,351 A * 3/1975 Smith .................... H01J 37/073
313/449
4,831,266 A 5/1989 Frosien et al.
(Continued)

FOREIGN PATENT DOCUMENTS

JP  57-165943 A  10/1982
JP  63-160144 A  7/1988
(Continued)

OTHER PUBLICATIONS

International Search Report (PCT/ISA/210) issued in PCT Application No. PCT/JP2014/077811 dated Nov. 18, 2014 with English-language translation (two (2) pages).
(Continued)

*Primary Examiner* — Eliza W Osenbaugh-Stewar
(74) *Attorney, Agent, or Firm* — Crowell & Moring LLP

(57) ABSTRACT

The purpose of the present invention is to be able to acquire high-resolution images in a scanning electron microscope using a combination of a cold cathode (CFE) electron source and a boosting process, even at low accelerating voltage enhancing the current stability of the CFE electron source. A configuration in which a CFE electron source (101), an anode electrode (103) at positive (+) potential, and an insulator (104) for isolating the anode electrode (103) from ground potential are accommodated within a single vacuum chamber (105), and an ion pump (106) and a non-evaporable getter (NEG) pump (107) are connected to the vacuum chamber (105), is employed.

19 Claims, 10 Drawing Sheets

(52) U.S. Cl.
CPC .............. *H01J 2237/022* (2013.01); *H01J 2237/06341* (2013.01); *H01J 2237/1825* (2013.01); *H01J 2237/2806* (2013.01)

(56) References Cited

U.S. PATENT DOCUMENTS

| | | | |
|---|---|---|---|
| 2006/0231773 A1 | 10/2006 | Katagiri et al. | |
| 2007/0102650 A1* | 5/2007 | Katagiri | H01J 37/18 250/492.3 |
| 2008/0283745 A1* | 11/2008 | Adamec | H01J 7/18 250/307 |
| 2008/0315122 A1 | 12/2008 | Katagiri et al. | |
| 2011/0089336 A1* | 4/2011 | Kasuya | H01J 37/073 250/424 |
| 2013/0092836 A1* | 4/2013 | Fober | H01J 37/05 250/307 |
| 2013/0140977 A1* | 6/2013 | Watanabe | H01J 37/073 313/460 |
| 2013/0327951 A1 | 12/2013 | Frosien | |
| 2014/0264019 A1 | 9/2014 | Adamec | |

FOREIGN PATENT DOCUMENTS

| | | |
|---|---|---|
| JP | 5-45887 U | 6/1993 |
| JP | 2006-294481 A | 10/2006 |
| JP | 2007-157682 A | 6/2007 |
| JP | 2009-4112 A | 1/2009 |
| JP | 2013-254736 A | 12/2013 |
| JP | 2014-183046 A | 9/2014 |

OTHER PUBLICATIONS

Japanese-language Written Opinion (PCT/ISA/237) issued in PCT Application No. PCT/JP2014/077811 dated Nov. 18, 2014 (four (4) pages).

Japanese-language Office Action issued in counterpart Japanese Application No. 2016-554956 dated Oct. 31, 2017 with English translation (11 pages).

\* cited by examiner

SCANNING ELECTRON MICROSCOPE

TECHNICAL FIELD

The present invention relates to a scanning electron microscope with a combination of a CFE electron source and a boosting process.

BACKGROUND ART

PTL 1 discloses a boosting process (a process in which primary electron beam is caused to pass in a SEM column with high accelerating voltage with a sample kept at ground potential and to be decelerated to ground potential immediately before passing an objective lens). A boosting process can realize, with low accelerating voltage, resolution much higher than a case where a single out-lens objective lens in which magnetic field is not immersed on a sample is used. Note that, in a commercial SEM with a boosting process, a schottky electron source (SE electron source) is mainly used.

PTLs 2 and 3 disclose a cold cathode (CFE: cold field-emission) electron source in which the electron source is not always heated. The current stability (10%/min) of the CFE electron source is extremely worse than that of the SE electron source. A SEM with a CFE electron source generally performs flushing to instantaneously heat the electron source in order to clean the surface of the electron source. Note that, emission current of the electron beam is reduced or varied by absorption and desorption of residual gas around the electron source after flushing. The longer the time required for the emission current to be reduced is, the more current stability of the CFE electron source is improved. Since decrease of emission current depends on the amount of residual gas around the electron source, a technique to further improve current stability by reducing residual gas around the electron source as much as possible with a non-evaporable getter pump in an electron gun chamber including the electron source is disclosed (PTLs 2 and 3).

PTL 4 conceptually discloses a SEM with a combination of a CFE electron source and a boosting process.

CITATION LIST

Patent Literature

PTL 1: JP-A-63-160144 (Japanese Patent No. 2789094)
PTL 2: JP-A-2009-4112
PTL 3: JP-A-2007-157682
PTL 4: JP-A-2013-254736

SUMMARY OF INVENTION

Technical Problem

Currently, although an SE electron source is used in a commercial SEM with a boosting process, while current stability of the SE electron source is very high (2%/hr or less), energy width thereof is as wide as 0.6 eV, and resolution characteristics are significantly deteriorated at low accelerating voltage (in particular, at 1 kV or less). On the other hand, energy width of a CFE electron source is 0.3 eV when a tungsten single crystal is used and can be a very advantageous electron source when improvement of resolution characteristics at low accelerating voltage of 1 kV or less is required.

Then, the inventors have pursued design and development to achieve the world's first commercial SEM with a combination of a CFE electron source and a boosting process; however, when the inventors combined a CFE electron source and a boosting process, they found that electric potential distribution around an extracting electrode and an anode electrode that form the electron source is more easily changed than a case in which a CFE electron source is not combined with a boosting process and that the amount of residual gas around the electron source becomes extremely large to lower current stability.

By the way, PTL 4 does not disclose a technical problem unique to a combination of a CFE electron source and a boosting process that the inventors have found (relationship between a cause or generation of residual gas and decrease in current stability).

In the course of study of a method for solving that unique technical problem newly found, the inventors found that a gas component generated from an insulator holding an anode electrode with positive (+) potential when electron beam is being emitted is not sufficiently removed by an existing ion pump, and found an idea to remove that gas component, by an ion pump and a non-evaporative getter (NEG) pump. Note that, because NEG pump has a disadvantage that it cannot exhaust chemically stable gas such as Ar and $CH_4$, current stability is not improved only with a NEG pump. On the other hand, an ion pump has an advantage that it can exhaust Ar and $CH_4$. Therefore, the inventors considered that it is important to remove a gas component generated from an insulator holding an anode electrode with positive (+) potential when electron beam is being emitted with a combination of an ion pump and a NEG pump in order to realize higher current stability.

This idea is not disclosed in PTL 4 described above nor in PTLs 2 and 3.

For example, although PTL 2 (JP-A-2009-4112) discloses an exhaust structure with a combination of an ion pump and a NEG pump as an example, only around the electron source as exhausted by the NEG pump. In addition, PTL 2 regards the length of vacuum waiting time of the MEG pump as a problem, and the idea of the present invention to intentionally widen an area to vacuum-exhaust to the downstream side is not achieved.

The paragraphs [0084] to [0085] of PTL 3 (JP-A-2007-157682) describe that a valve 21 or a valve 16 is closed before the system is operated and disclose that the vicinity of an electron gun is exhausted only with a MEG pump during SEM observation. That is, PTL 3 does not show an idea to vacuum-exhaust with a combination of an ion pump and a NEG pump during emission of electron beam as in the present invention.

Solution to Problem

In order to solve the problem described above, a configuration described in the claims is adopted, for example. Although the present specification includes several methods for solving the problem described above, it adopts a configuration of a scanning electron microscope with a combination of a CFE electron source and a boosting process in which a CFE electron source, an anode electrode with positive (+) potential, and an insulator that separates the electrode from ground potential are housed in one vacuum chamber and an ion pump and a NEG pump are connected to the vacuum chamber.

In addition, as another example, a configuration of a scanning electron microscope with a combination of a CFE electron source and a boosting process in which a first ion pump and a first NEG pump are connected to a first vacuum chamber that houses a CFE electron source and a second ion pump and a second NEG pump are connected to a second vacuum chamber that houses an anode electrode with positive (+) potential and an insulator that separates the electrode from ground potential is adopted.

Advantageous Effects of Invention

According to the present invention, it is possible to obtain an image with high resolution even at low accelerating voltage with increased current stability of a CFE electron source even when a CFE electron source and a boosting process are used in combination. Other problems, structures, and effects other than those described above will be apparent by the description of the following embodiments.

DESCRIPTION OF EMBODIMENTS

Figure 1:
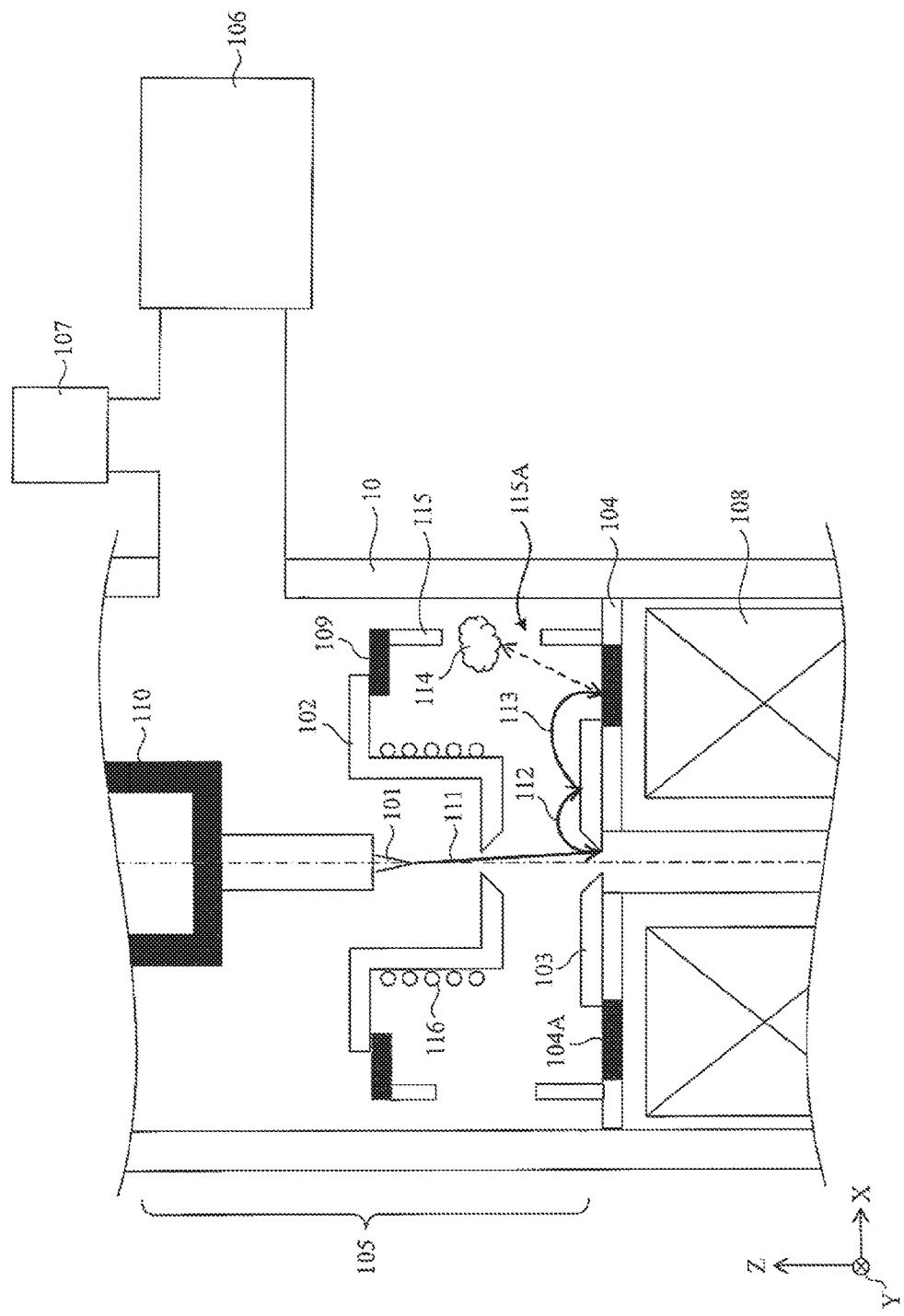
FIG. 1 is a cross-sectional view illustrating a device structure of an electron source according to a first example and therearound.

In an example, a scanning electron microscope that includes a CFE (cold field-emission) electron source, an extracting electrode for extracting electron from the CFE electron source, an anode electrode with positive (+) potential for accelerating the electron and for outputting the electron to an optical system located at a downstream side, a first insulator for separating the anode electrode from ground potential, a single vacuum chamber including both the CFE electron source and the anode electrode, an ion pump connected to the vacuum chamber, a PEG pump connected to the vacuum chamber, a lens tube housing the CFE electron source, the extracting electrode, the anode electrode, the first insulator, the vacuum chamber, the ion pump, and the NEG (non-evaporative getter) pump, and a sample chamber connected to the lens tube is disclosed. In addition, a scanning electron microscope that further includes a second insulator for separating the extracting electrode from ground potential, and a attaching member with at least one side cave connecting a cylindrical part with outer diameter smaller than inner diameter of the lens tube to an inner space and an outer space of the attaching member, which is the cylindrical attaching member for fixing the extracting electrode to a casing via the second insulator and for housing the anode electrode together with the extracting electrode, is disclosed. In addition, an aspect in which a space where the anode electrode is located is connected to a space where the electron source is located via a side cave formed in the attaching member and a connecting path formed between a cylindrical part of the attaching member and the casing is disclosed.

In addition, in the example, a scanning electron microscope that includes a CFE (cold field-emission) electron source, an extracting electrode for extracting electron from the CFE electron source, a first vacuum chamber located at an upstream side with respect to the extracting electrode and for housing the electron source, an anode electrode with positive (+) potential for accelerating the electron and outputting the electron to an optical system located at a downstream side, a first insulator for separating the anode electrode from ground potential, a second vacuum chamber located at a downstream side with respect to the extracting electrode and for housing the anode electrode, a first ion pump connected to the first vacuum chamber, a first NEG (non-evaporative getter) pump connected to the first vacuum chamber, a second ion pump connected to the second vacuum chamber, a second NEG (non-evaporative getter) pump connected to the second vacuum chamber, a lens tube for housing the CFE electron source, the extracting electrode, the first vacuum chamber, the anode electrode, the first insulator, the second vacuum chamber, the first and the second ion pumps, and the first and the second NEG pumps, and a sample chamber connected to the lens tube is disclosed.

In addition, in the example, the CFE electron source is any of a tungsten single crystal chip, a nanochip, a carbon nanotube chip, and a superconductive chip.

In addition, in the example, the first insulator is made of ceramics or engineering plastic.

In addition, in the example, the first insulator is attached to a position where second electron emitted when electron passing the extracting electrode collides with the anode electrode and/or third electron emitted when the second electron re-collides with an anode electrode or an inner wall of the vacuum chamber do not collide therewith.

In addition, in the example, the anode electrode has a structure for prevent second electron emitted when electron passing the extracting electrode collides with the anode electrode and/or third electron emitted when the second electron re-collides with an anode electrode or an inner wall of the vacuum chamber from colliding with the first insulator.

In addition, in the example, the scanning electron microscope further includes a heater that can temporarily selectively heat the extracting electrode.

In addition, in the example, the scanning electron microscope further includes a control electrode provided between the extracting electrode and the anode electrode, and a second insulator for separating the control electrode from ground potential, and the second insulator is attached to a position where second electron emitted when electron passing the extracting electrode collides with the control electrode and/or third electron emitted when the second electron re-collides with the extracting electrode, the anode electrode, and/or an inner wall of the vacuum chamber do not collide therewith.

In addition, in the example, the scanning electron microscope further includes a control electrode provided between the extracting electrode and the anode electrode and a second insulator for separating the control electrode from ground potential, and the control electrode has a structure for preventing second electron emitted when electron passing the extracting electrode collides with the control electrode and/or third electron emitted when the second electron re-collides with the extracting electrode, the anode electrode, and/or an inner wall of the vacuum chamber from colliding with the second insulator.

In addition, in the example, the scanning electron microscope further includes a monochrome meter unit including a second insulator as one component and provided between the extracting electrode and the anode electrode, and the monochrome meter unit has a structure for preventing second electron emitted when electron passing the extracting electrode collides with a non-insulator in the monochrome meter unit and/or third electron emitted when the second electron re-collides with the non-insulator, the extracting electrode, the anode electrode, and/or an inner wall of the vacuum chamber from colliding with the second insulator.

Hereinafter, embodiments of the present invention will be described with reference to the drawings. Note that, the embodiments of the present invention are not limited to examples of modes described later and may be modified in various ways without departing spirit of technique thereof.

(1) First Example (1-1) Device Structure
(Entire Structure)

Figure 2:
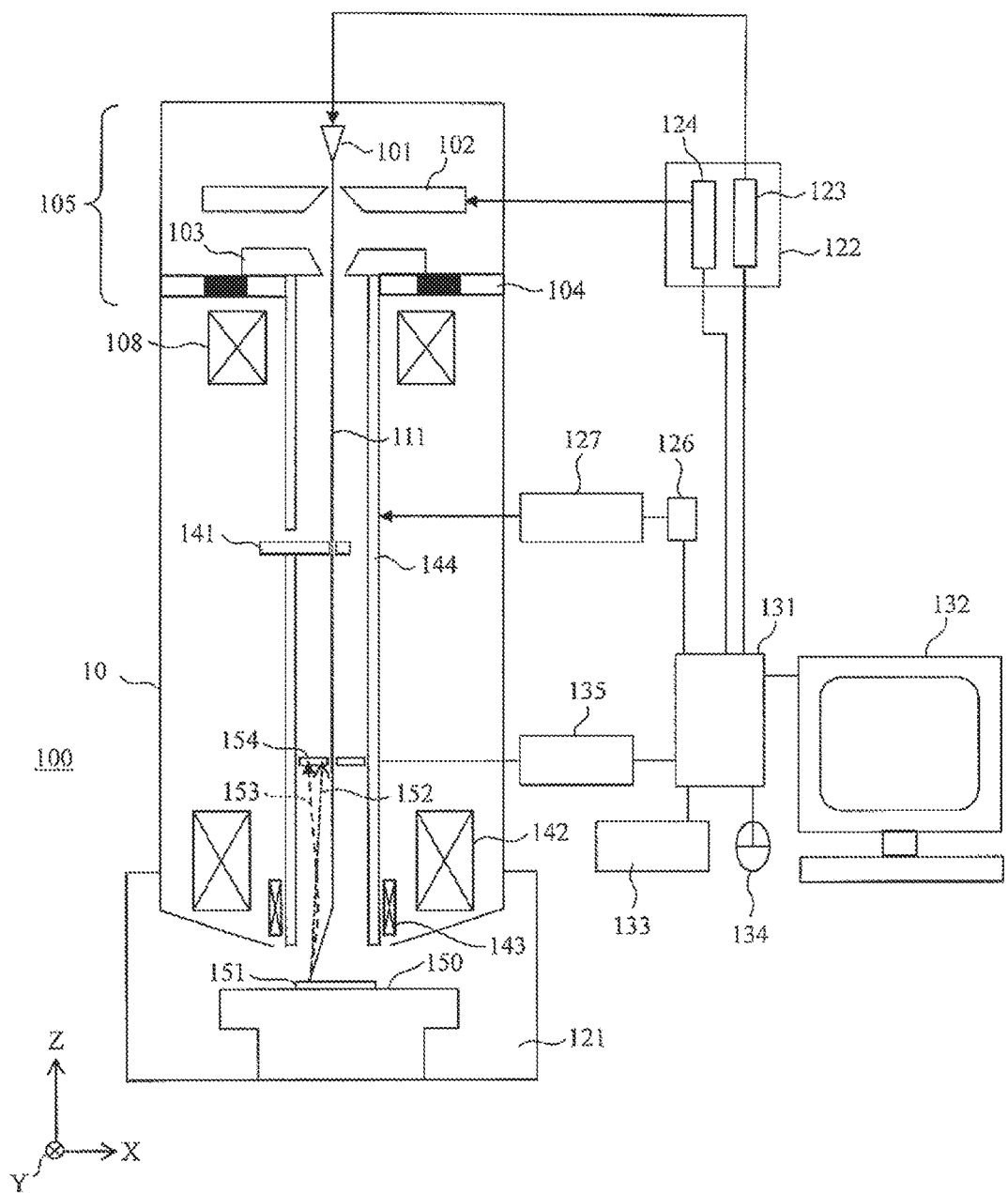
FIG. 2 illustrates an entire structure of a scanning electron microscope according to the first example.

FIG. 2 illustrates an example of an entire structure of a scanning electron microscope 100 according to the present example. The scanning electron microscope 100 includes a lens tube (column) 10, a sample chamber 121, various power sources, and a control unit. As the various power sources described above, for example, a power source unit 122 (accelerating voltage power source 123 and extracting voltage power source 124) and a booster voltage power source 126 are prepared. The accelerating voltage power source 123 is connected to an electron source 101, the extracting voltage power source 124 is connected to an extracting electrode 102, and the booster voltage power source 126 is connected to an anode electrode 103 and a booster electrode 144 via a booster control substrate 127. The control unit includes control a microcomputer/control PC 131, a monitor display 132, a keyboard 133, a mouse 134, and a detection controller 135.

In the lens tube (column) 10, an objective movable diaphragm 141 for adjusting beam diameter and the amount of probe current of primary electron beam 111 emitted from the electron source 101 is provided at a downstream side of a condenser lens 108. The primary electron beam 111 passing the objective movable diaphragm 141 is converged by an objective lens 142 and deflection-scanned by a deflector 143. The primary electron beam 111 to be deflection-scanned is emitted to an observation area of a sample 151 placed on a stage 150 provided in the sample chamber 121. Note that, the objective movable diaphragm 141 is provided inside the cylindrical booster electrode 144.

Reflected electron 152 and secondary electron 153 generated from the observation area of the sample 151 are detected by a detector 154. Note that, a detection signal of the detector 154 is provided to the control microcomputer/control PC 131 via the detection controller 135 described above, and displayed on the monitor display 132 as a two-dimensional image via image processing by the control microcomputer/control PC 131.

(Configuration Around Electron Source)

FIG. 1 illustrates a device structure or the electron source 101 and therearound. FIG. 1 illustrates a cross-section of a device structure around the electron source. Many of parts appearing in the lens tube (column) 10 have rotational symmetry with respect to the axis line obtained by extending the electron source 101.

The electron source 101 according to the present example is an electron source that does not always heat. Such an electron source is generally referred to as CFE electron source. As the electron source 101, for example, a tungsten single crystal chip, a carbon nanotube chip, a nanochip with curvature radius of the tip sharpened in nanometer order or made by deposition of electron beam or ion beam on a member, or a superconductor chip is used. Certain. CFE electron sources show characteristics with emission current not attenuated; however, the higher the degree of vacuum therearound is, the more stable emission current is with respect to all types of CFE electron source.

The description returns to the description of the device structure illustrated in FIG. 1. The electron source 101 is attached to the lens tube (column) 10 via an insulator 110. With this structure, the electron source 101 is separated from ground potential and kept at high voltage (for example, negative potential from 0.1 kV to 30 kV). At a downstream side of the electron source 101, the extracting electrode 102 is provided. The extracting electrode 102 has a substantially well-shaped or substantially deep bowl-shaped cross-sectional shape, and is attached to a cylinder 115 (attaching member) provided inside the lens tube (column) 10 via an insulator 109. Note that, the lower end of the cylinder 115 is attached to an insulating flange 104.

By attachment to the lens tube (column) 10 via the insulator 109, the extracting electrode 102 is also separated from ground potential and kept at high voltage. Several side caves 115A are discretely formed on the side of the cylinder 115. A sub vacuum chamber (corresponding to the downstream part of differential exhaustion system) surrounded by the cylinder 115, the extracting electrode 102, and the anode electrode 103 is connected to a sub vacuum chamber (corresponding to the upstream part of differential exhaustion system) on the side where the electron source 101 is provided via the side cave 115A. Although the side caves 115A with the same diameter are formed at the same height positions on the right and left sides of the cylinder 115 in FIG. 1, the height position where the side cave 115A is formed is optional. That is, the height positions of the side caves 115A may be the same or different with respect to the circumferential direction. In addition, the side caves 115A may be formed in plural with different height at the same positions on the circle.

The voltage applied to the extracting electrode 102 (extracting voltage) is generally kept at positive potential of 2 kV to 7 kV with respect to the potential applied to the electron source 101. Note that, when a nanochip is used as the extracting electrode 102, the extracting voltage is the order of several hundred volts. The primary electron beam 111 is extracted from the tip of the electron source 101 by this extracting voltage. A diaphragm that allows part of the extracted primary electron beam 111 to pass is formed at the center of the extracting electrode 102 (on axis line of the electron source 101). Generally, a heating heater 116 is provided on the outer face of the cylindrical part of the extracting electrode 102 that houses the electron source 101. The heating heater 116 is controlled to be on while the primary electron beam 111 is not being emitted (while SEM observation is being stopped) and heats the extracting electrode 102. The gas absorbed on the surface of the extracting electrode 102 is thermally desorbed by this heating. As a result, during SEM observation, the amount of generation of gas is suppressed even if the primary electron beam 111 collides with the extracting electrode 102.

The anode electrode 103 is provided at a downstream side of the extracting electrode 102. The anode electrode 103 is attached to the lens tube (column) 10 via the insulating flange 104 (including an insulator 104A). The anode electrode 103 is separated from ground potential by the insulating flange 104 and kept at high voltage (accelerating voltage). In the present example to which a boosting process is applied, the anode electrode 103 is generally kept at positive potential of maximum 10 kV. With this accelerating voltage, the primary electron beam 111 passing the diaphragm of the extracting electrode 102 is accelerated and output to an optical system (for example, the condenser lens 108) at a downstream side.

The insulating flange 104 separates a space (electron source chamber) at an upstream side with respect to the insulating flange 104 from a space (intermediate chamber) at a downstream side with respect to the insulating flange 104 except a diaphragm formed at the center thereof (on axis line of the electron source 101). Hereinafter, container defining a space (electron source chamber) including the electron source 101 is referred to as vacuum chamber 105. As described, the electron source 101 and the anode electrode 103 according to the present example are housed in one (or common) vacuum chamber 105. The vacuum chamber 105 is kept at ground potential. A space between the vacuum chamber 105 (electron source chamber) and the intermediate chamber (space housing the condenser lens 108 and the like) are differentially exhausted via the diaphragm of the insulating flange 104.

Two vacuum pumps are used for vacuum exhaustion of the vacuum chamber 105. One is a main vacuum pump 106 and the other is a sub vacuum pump 107. The main vacuum pump 106 is a pump that can make the vacuum chamber 105 vacuum state of about $10^{-8}$ hPa alone. For example, an ion pump is used as the main vacuum pump 106. The sub vacuum pump 107 is a pump used for the purpose of increasing the degree of vacuum of the vacuum chamber 105. For example, a NEG pump is used as the sub vacuum pump 107. There may be several main vacuum pumps 106 and several sub vacuum pumps 107. Although FIG. 1 illustrates a parallel structure in which the sub vacuum pump 107 is provided at an upstream side of the main vacuum pump 106, a structure in which the sub vacuum pump 107 and the main vacuum pump 106 are serially arranged is also possible.

(1-2) Improvement of Current Stability

Next, a phenomenon that occurs in the scanning electron microscope according to the present example will be described. As described above, potential of the anode electrode 103 is kept higher than that of the extracting electrode 102. Therefore, secondary electron (secondary electron or reflected electron) 112 generated when the primary electron beam 111 collides with the anode electrode 103 cannot reach the extracting electrode 102, and collides with the anode electrode 103 again. Secondary electron 113 is generated by this re-collision.

The secondary electron 113 collides with the insulator 104A included in the insulating flange 104 by potential relationship with its surrounding (potential relationship with the extracting electrode 102, the anode electrode 103, the vacuum chamber 105, and the condenser lens 108). However, the insulator 104A has a porous structure, and much gas is absorbed thereon or occluded therein. Therefore, the insulator 104A emits much gas 114 in the vacuum chamber 105 from, a part where the secondary electron 113 collides with. The generation of the gas 114 is a cause of deterioration of current stability when a CFE electron source is used in combination with a boosting process.

Note that, the insulator 104A is an insulator for electrically separating ground potential from booster potential, and as described, absorption gas on the surface and occluded gas inside thereof are discharged when the secondary electron 113 collide therewith. In addition, the surface of the insulator 104A is charged by collision of the secondary electron 113. Although the insulator 104A is generally made of ceramics, it may be made of engineering plastic. The gas 114 is also generated by re-collision of secondary electron generated by re-collision of the secondary electron 113 with the inner wall of the lens tube (column) 10 with the insulator 104A.

By the way, in the scanning electron microscope according to the present example, the electron source 101 and the anode electrode 103 are included in one (same) vacuum chamber 105. Specifically, as illustrated in FIG. 1, a space including the electron source 101 is connected to a space including the anode electrode 103 at an upper part near the area where the gas 114 is generated (a position near the side cave 115A with relatively large caliber formed n the cylinder 115 and far from the diaphragm with relatively small caliber formed in the extracting electrode 102). Therefore, most part of the generated gas 114 passes not the diaphragm of the extracting electrode 102 but the side cave 115A with relatively small resistance with respect to molecule level, and is exhausted by the main vacuum pump 106 and the sub vacuum pump 107. That is, in the present example, most part of the gas 114 passes through a connecting path formed between the lens tube (column) 10 and the cylinder 115 from the side cave 115A and is exhausted by the main vacuum pump 106 and the sub vacuum pump 107.

As a result, the main vacuum pump 106 and the sub vacuum pump 107 can sufficiently exhaust the gas 114 from the vacuum chamber 105 without increasing the amount of residual gas around the electron source even temporarily.

Figure 3:
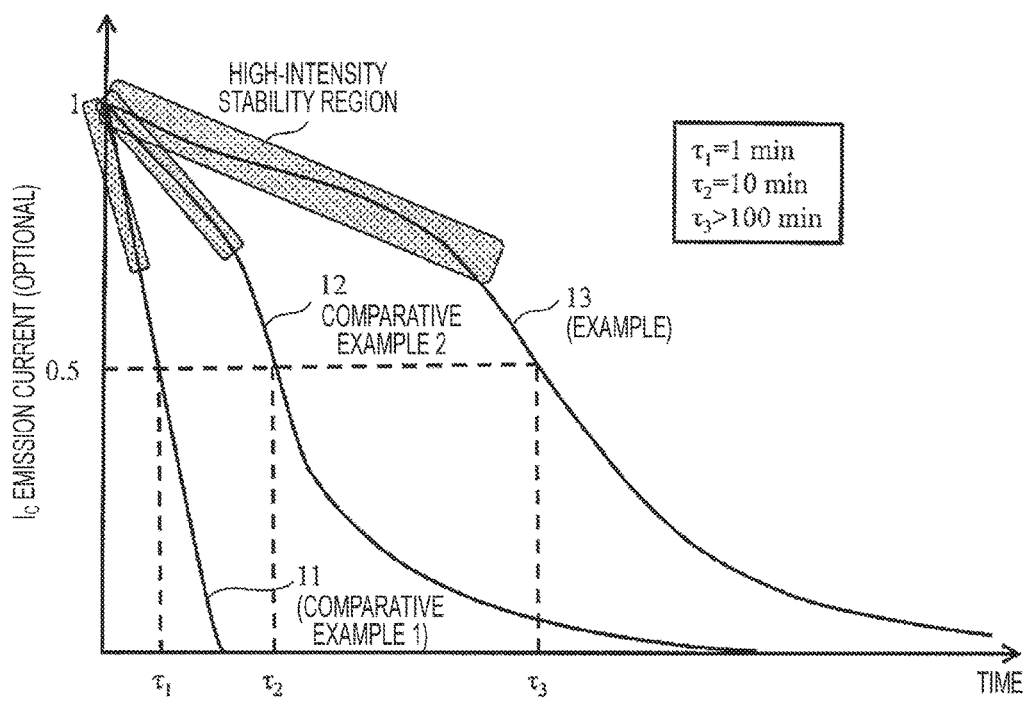
FIG. 3 shows attenuation characteristics of emission current emitted from the electron source.

FIG. 3 shows attenuation characteristics of emission current immediately after flushing. An attenuation characteristics curve 13 according to the present example shows that the time required for emission current to attenuate from the initial set value to half thereof is about 100 min or more. Note that, an attenuation characteristics curve 11 shows characteristics corresponding to the comparative example 1 described later and an attenuation characteristics curve 12 shows characteristics corresponding to the comparative example 2 described later.

Comparative Example 1

A scanning electron microscope in which a vacuum chamber (including an electron source 101) at an upstream side with respect to an extracting electrode 102 and a vacuum chamber (including an anode electrode 103) at a downstream side with respect to the extracting electrode 102 are independently provided as different vacuum chambers, and a main vacuum pump is connected to each vacuum chamber.

Comparative Example 2

In addition to the configuration of comparative example 1, a scanning electron microscope in which a sub vacuum pump is connected only to the vacuum chamber (including the electron source 101) at an upstream side with respect to the extracting electrode 102.

As illustrated in FIG. 3, a half-value period of the emission current (current applied to entire primary electron beam 111 discharged from the electron source 101) from the initial set value in the comparative example 1 is about 1 min, and a half-value period of emission current from the initial set value in the comparative example 2 is about 10 min, which confirms configuration of the present example is superior. This means that high-intensity stability region can be kept longer in the present example than in the comparative examples 1 and 2. Generally, high-intensity stability region refers to region in which emission current is 50% or more with respect to the original and probe current (emission current passing the diaphragm of the extracting electrode 102) is 90% or more with respect to the original. In the high-intensity stability region, a unique noise called CFE noise is low, and probe beam scanning a sample surface is stable at high intensity. Therefore, in the present example, it is possible to keep probe current at high intensity longer than in the comparative examples.

(1-3) Overview

By adopting the configuration of the present example, it is possible to cause emission current or probe current to stably operate to obtain an image with high resolution even if the primary electron beam 111 extracted from the CFE electron source is accelerated by accelerating voltage of 2 kV or less (even if a CFE electron source and a boosting process are combined). Therefore, it is possible to observe with SEM even if the sample is a magnetic body or the shape of the sample is not flat. As a result, convenience or the user is dramatically improved. Note that, although scanning electron microscope has been described in the present example, the microscope structure according to the present example can be applied to a compound charged particle beam device in which an FIB and a SEM co-exist. This is also true for the subsequent examples.

(2) Second Example (2-1) Device Structure

Figure 4:
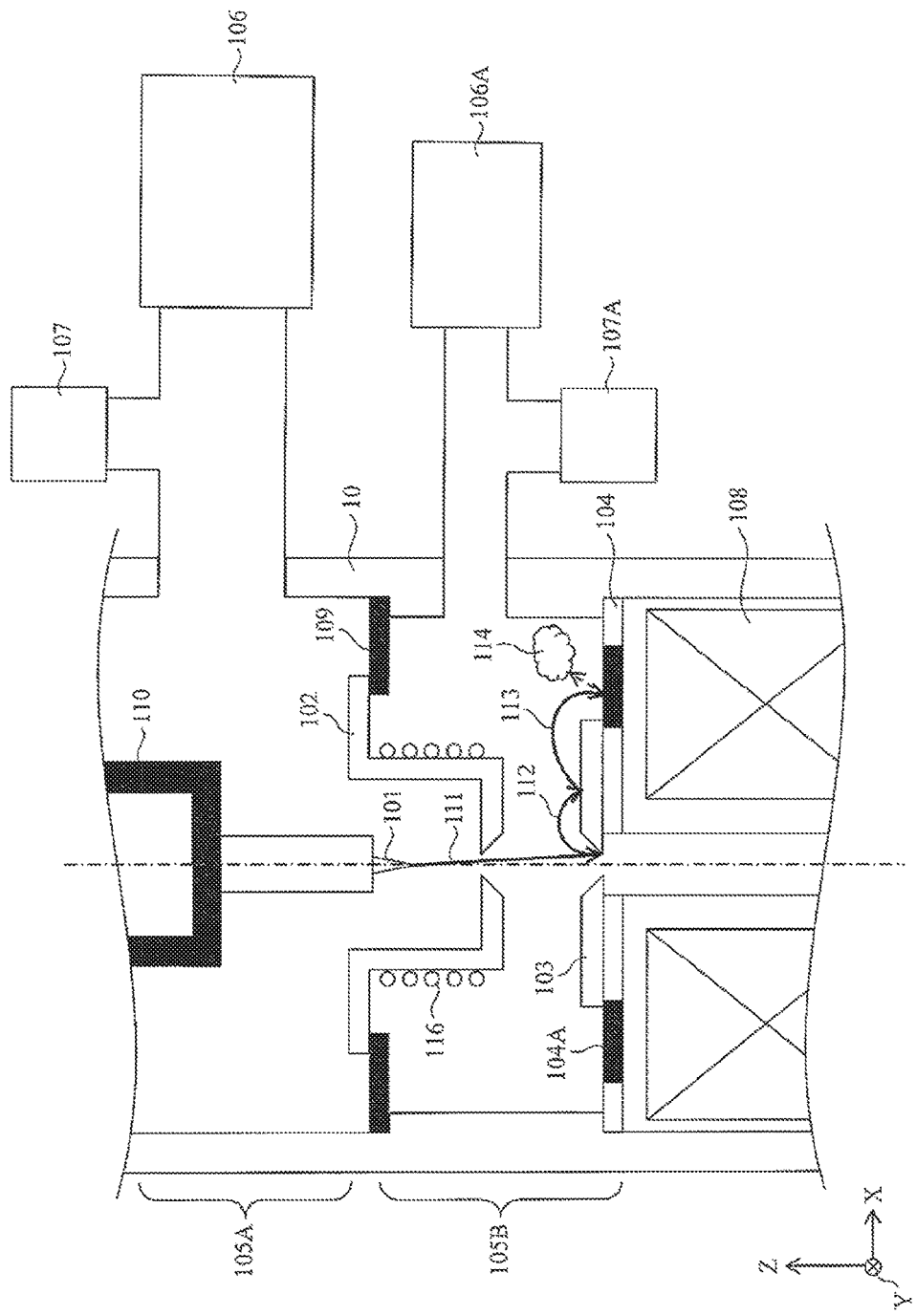
FIG. 4 is a cross-sectional view illustrating a device structure of an electron source according to a second example and therearound.

FIG. 4 illustrates a device structure of an electron source and therearound that form a scanning electron microscope according to the present example. In FIG. 4, the parts that correspond to FIG. 1 are given the same reference numerals. One difference between FIG. 4 and FIG. 1 is that, in FIG. 4, an outer periphery of an insulator 109 is directly fixed to an inner wall surface of a lens tube (column) 10 over the entire circumference, and as a result, independent two vacuum chambers are provided. That is, in a scanning electron microscope according to the present example, a vacuum chamber 105A (including an electron source 101) that defines a space at an upstream side with respect to an extracting electrode 102 and a vacuum chamber 105B (including an anode electrode 103) that defines a space at a downstream side with respect to the extracting electrode 102 are independently provided.

Another difference between FIG. 4 and FIG. 1 is that, in FIG. 4, main vacuum pump and a sub vacuum pump are provided to each of the vacuum chambers 105A and 105B. That is, a main vacuum pump 106 and a sub vacuum pump 107 are provided to the vacuum chamber 105A, and a main vacuum pump 106A and a sub vacuum pump 107A are provided to the vacuum chamber 105B. In the present example, gas 114 generated by collision of secondary electron 113 with an insulator 104A can be promptly and sufficiently exhausted via the main vacuum pump 106A and the sub vacuum pump 107A provided to the vacuum chamber 1053 that is the same as the generation source.

In other words, most part of the gas 114 generated while the scanning electron microscope is being used is exhausted by the main vacuum pump 106A and the sub vacuum pump 107A connected to the vacuum chamber 105B at a downstream side. As a result, it is possible to prevent possibility of temporal increase of gas concentration around the electron source 101. Therefore, an effect similar to that of the scanning electron microscope according to the example 1 (attenuation characteristics curve 13 of FIG. 3) can be obtained.

(3) Third Example

While a technique to efficiently exhaust the gas 114 generated by collision of the secondary electron 113 with the insulator 104A from the vacuum chamber has been described in the first and the second examples described above, a structure that can prevent generation of the gas 114 will be described in the present example.

(3-1) Device Structure

Figure 5:
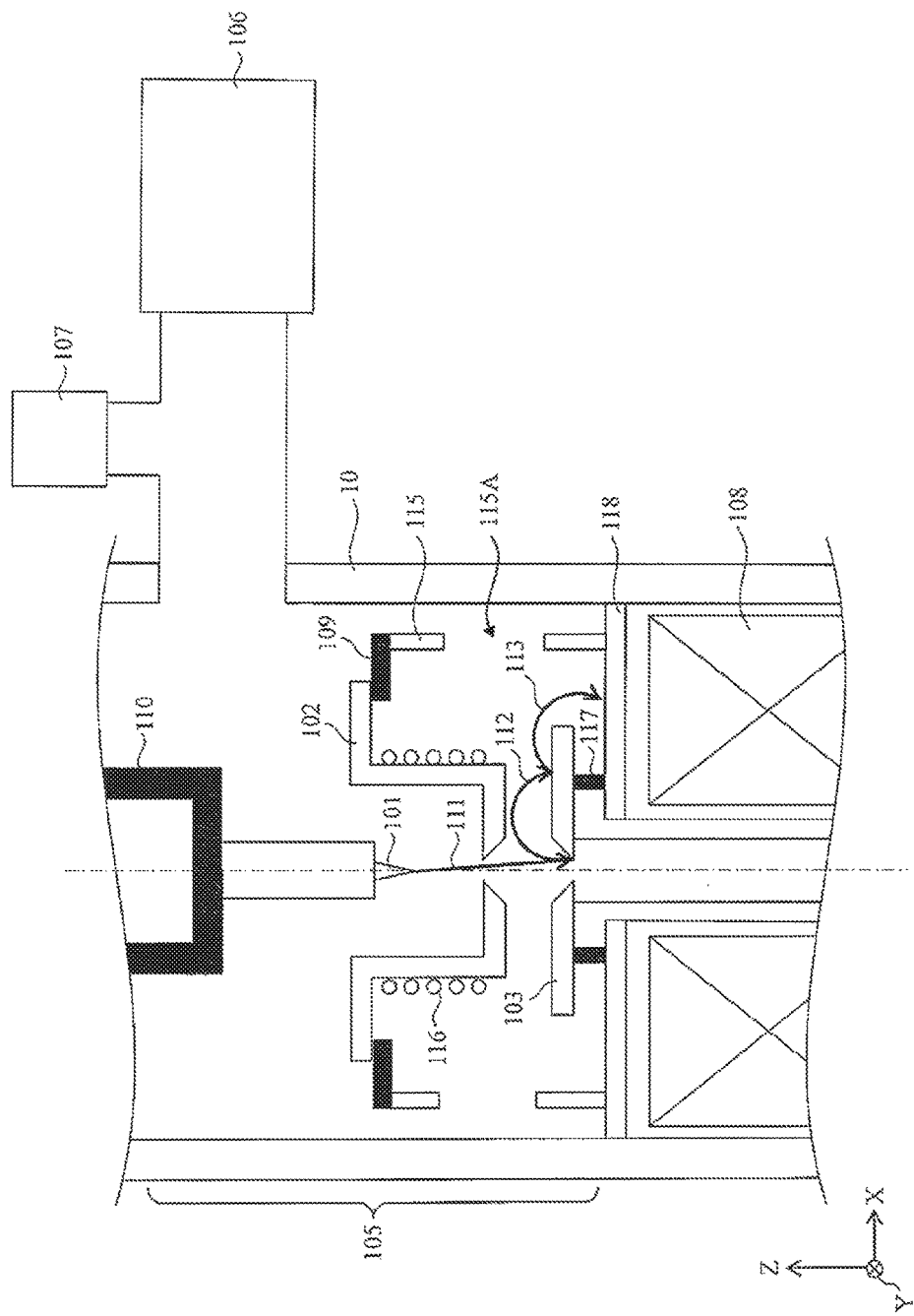
FIG. 5 is a cross-sectional view illustrating a device structure of an electron source according to a third example and therearound.

FIG. 5 illustrates a device structure of an electron source and therearound that form a scanning electron microscope according to the present example. In FIG. 5, the parts that correspond to FIG. 1 are given the same reference numerals. That is, in the present example, a structure including both an electron source 101 and an anode electrode 103 in one vacuum chamber 105 is assumed. A difference between FIG. 5 and FIG. 1 is an attaching structure of an insulator 117 and the anode electrode 103 to an insulating flange 118 of FIG. 5.

In FIG. 1, the insulating flange 104 and the insulator 104A are integrally formed and the anode electrode 103 is placed to be over the surface of the inner periphery of the insulating flange 104 and the surface of a part of the insulator 104A. Therefore, most parts of the insulator 104A are exposed to the outside of the anode electrode 103. However, in the structure illustrated in FIG. 5, the anode electrode 103 is placed on the insulator 117 that is placed on the insulating flange 118. That is, the anode electrode 103 is separated from the insulating flange 118 with the insulator 117 in between.

The insulator 117 is tubular, and while the inner face thereof is located to the outside of the diaphragm formed at the center of an insulating flange 104, the outer face thereof is at least provided to be located inside the outer edge of the anode electrode 103. Provided, however, that the outer face of the insulator 117 needs to be attached to the position where secondary electron 113 generated at the anode electrode 103 and the like cannot come around as illustrated in FIG. 5. For example, if the height of the insulator 117 (z direction) is large and a space between the anode electrode 103 and the insulating flange 118 is large, it is provided so that the outer face of the insulator 117 is separated from the outer edge of the anode electrode 103 as much as possible (located inside) On the other hand, if the height of the insulator 117 (z direction) is small and a space between the anode electrode 103 and the insulating flange 118 is small, it is possible to provide the outer face of the insulator 117 near the outer edge of the anode electrode 103.

(3-2) Summary

If the microscope structure according to the present example is adopted, it is possible to prevent collision of the secondary electron 113 generated at the anode electrode 103 with the insulator 117 even if primary electron beam 111 extracted from the OFF electron source is accelerated by accelerating voltage of 2 kV or less (even if a CFE electron source and a boosting process are combined). Therefore, as with the example described above, it is possible to cause emission current and probe current to stably operate to obtain an image with high resolution. Moreover, since gas 114 is not generated essentially in the present example, it is possible to use a scanning electron microscope while maintaining conditions around the electron source 101 better than in the example 1. Note that, the microscope structure according to the present example can also be applied to the second example (FIG. 4).

(4) Fourth Example

Figure 6:
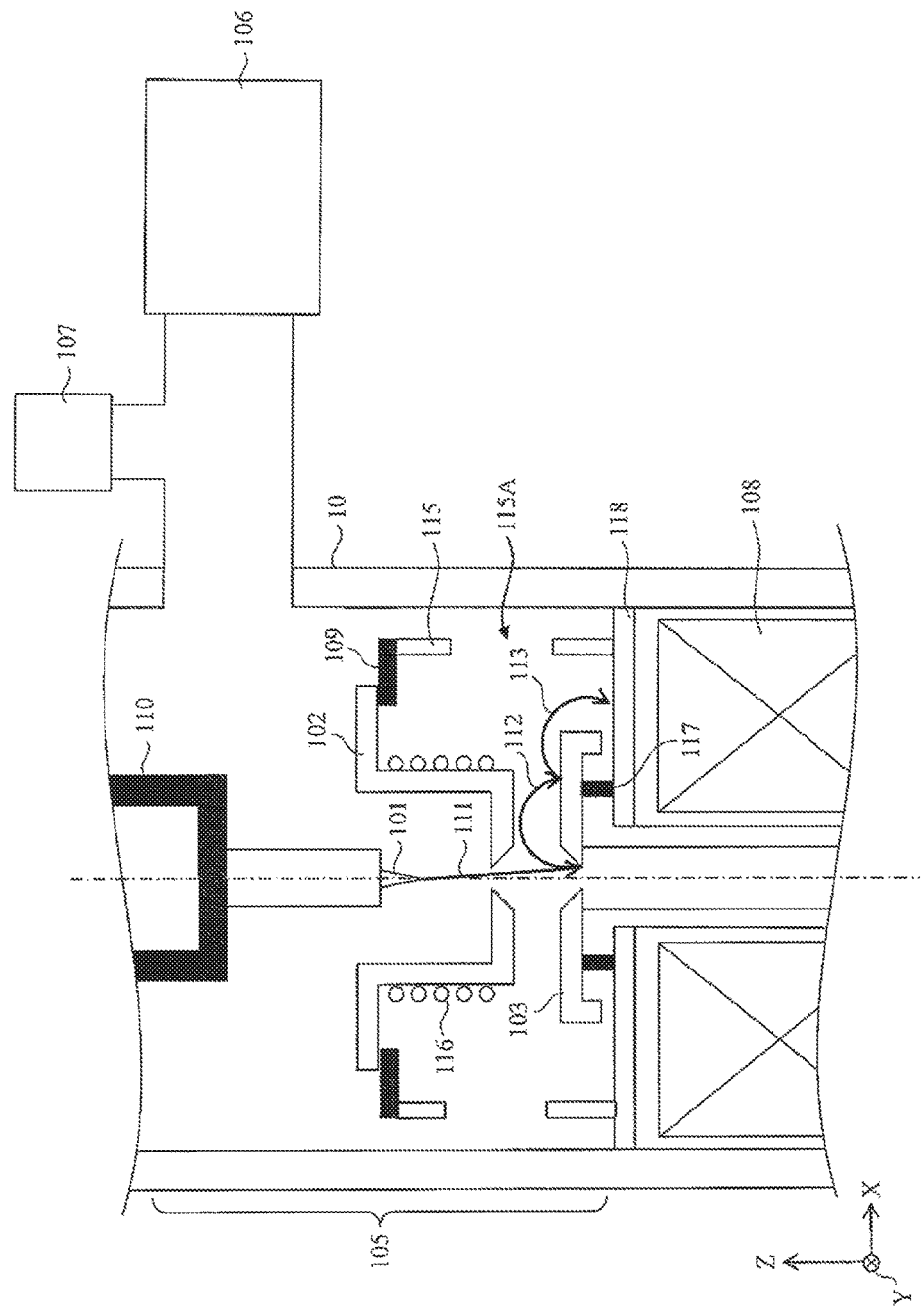
FIG. 6 is a cross-sectional view illustrating a device structure of an electron source according to a fourth example and therearound.

FIG. 6 illustrates a device structure of an electron source and therearound that form a scanning electron microscope according to the present example. In FIG. 6, the parts that correspond to FIG. 5 are given the same reference numerals. A difference between FIG. 6 and FIG. 5 is a shape of an anode electrode 103. The anode electrode 103 according to the present example is different in that a structure forming a cross-section L shape is formed as a member with a skirt shape projecting downward from a lower face thereof so as to extend along the outer peripheral edge of the anode electrode 103. However, the member with the skirt shape mentioned here does not contact with an insulating flange 118. The member with the skirt shape functions to make a space formed between the anode electrode 103 and the insulating flange 118 smaller and to make it more difficult for secondary electron 113 to come around to collide with an insulator 117.

By adopting the microscope structure according to the present example, it is possible to prevent generation of gas in a vacuum chamber 105 more than in the third example. In addition, since the size of the space can be adjusted by the length of the member with the skirt shape of the anode electrode 103, it is possible to increase the distance between the anode electrode 103 and the insulating flange 118 by increasing the height of the insulator 117. The microscope structure according to the present example can also be applied to the second example (FIG. 4).

(5) Fifth Example

Figure 7:
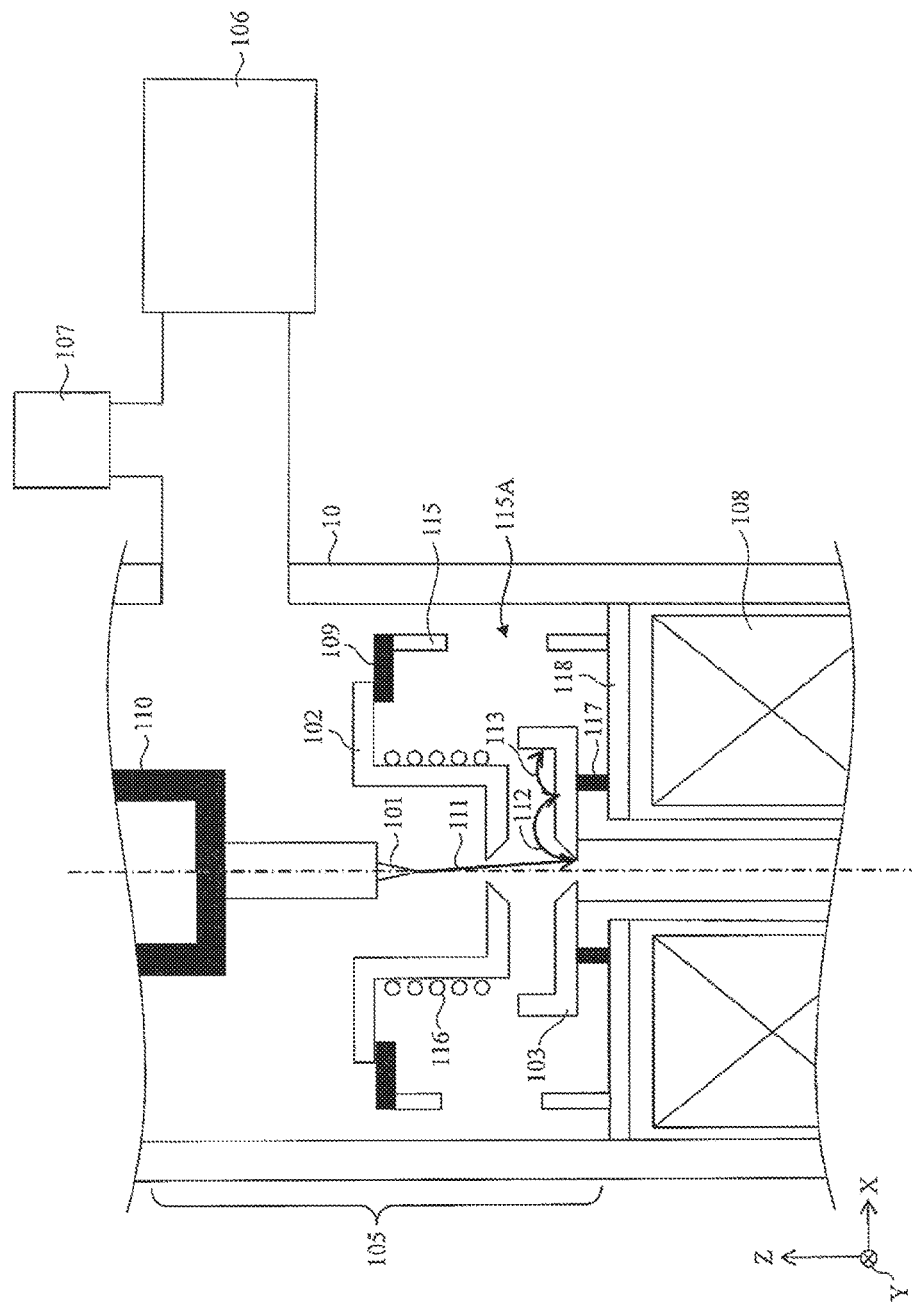
FIG. 7 is a cross-sectional view illustrating a device structure of an electron source according to a fifth example and therearound.

FIG. 7 illustrates a device structure of an electron source and therearound that form a scanning electron microscope according to the present example. In FIG. 7, the parts that correspond to FIG. 6 are given the same reference numerals. A difference between FIG. 7 and FIG. 6 is a shape of an anode electrode 103. The anode electrode 103 according to the present example is different from the structure of the fourth example in that the structure forming a cross-section L shape is formed as a wall structure projecting upward from an upper surface thereof so as to extend along the outer peripheral edge of the anode electrode 103.

The reason for using the substantially bowl-shaped or substantially deep plate-shaped anode electrode 103 is to prevent secondary electron 113 from coming out of the anode electrode 103. Also by this means, it is possible to reduce the amount of generation of gas 114 by collision of the secondary electron 113 with an insulator 117 as with the fourth example. Note that, the height of the wall structure can be any height in so far as the secondary electron 113 can be prevented from coming around.

By adopting the microscope structure according to the present example, it is possible to prevent generation of gas 114 in a vacuum chamber 105 as with the fourth example described above. In addition, since the secondary electron 113 is prevented from coming around by the wall structure, the height of the insulator 117 can be arbitrarily set. The microscope structure according to the present example can also be applied to the second example (FIG. 4).

(6) Sixth Example

Figure 8:
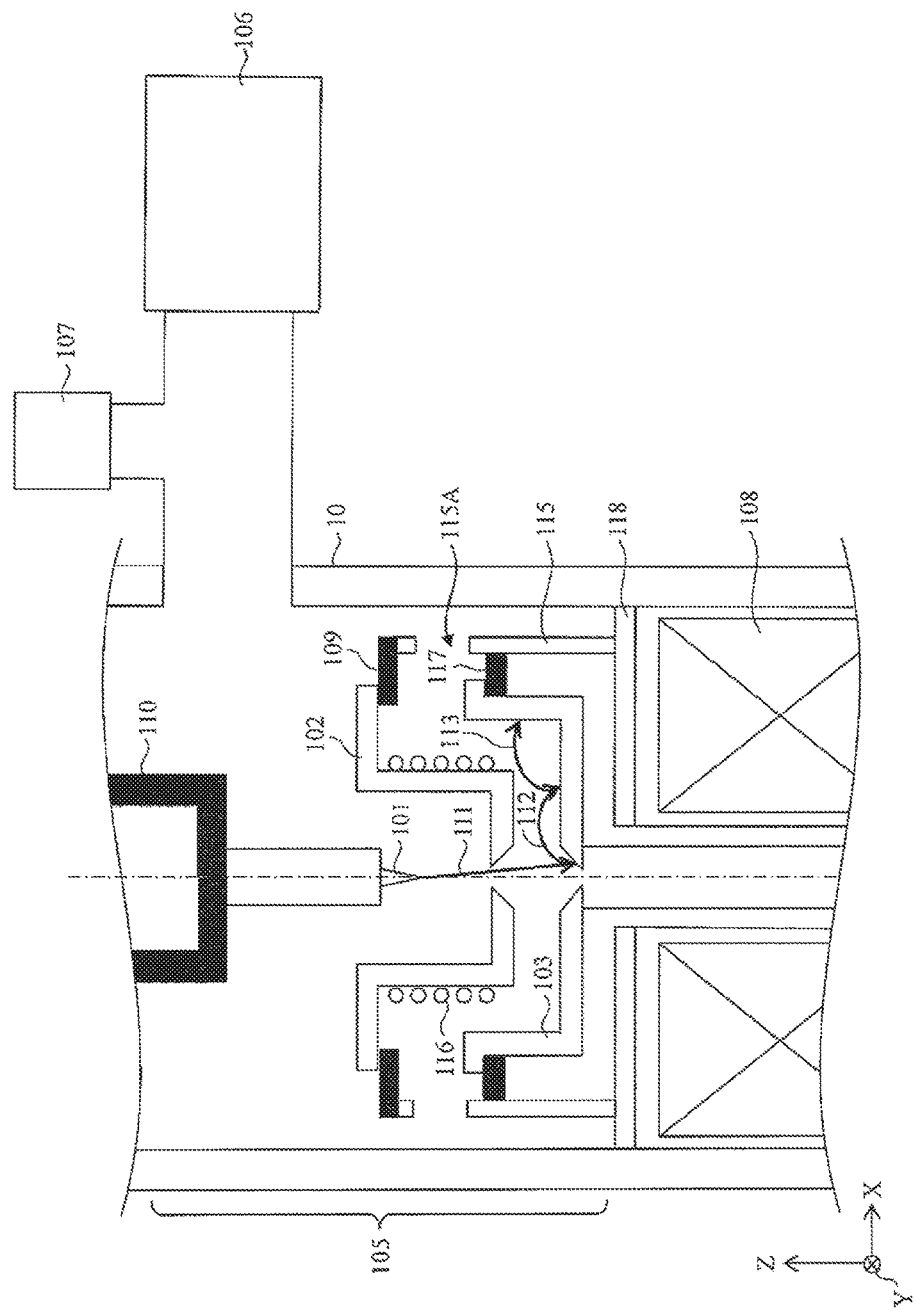
FIG. 8 is a cross-sectional view illustrating a device structure of an electron source according to a sixth example and therearound.

FIG. 8 illustrates a device structure of an electron source and therearound that form a scanning electron microscope according to the present example. In FIG. 8, the parts that correspond to FIG. 7 are given the same reference numerals difference between FIG. 8 and FIG. 7 is an attaching structure of an anode electrode 103 against an insulating flange 118. Specifically, it is different in that it is connected to an insulator 117 at an outer face near an upper end of the wall structure projecting upward from an upper face of the anode electrode 103 along the outer peripheral edge and is attached to a cylinder 115 that is attached to the insulating flange 118 via the insulator 117. In FIG. 8, the insulator 117 is attached to the cylinder 115 at a position lower than a side cave 115A. However, the attaching structure is not limited thereto and may be a structure in which an insulator 109 and the insulator 117 are directly attached to a lens tube (column) 10.

Note that, in the present example, the height of the wall structure projecting upward from the upper face of the anode electrode 103 along the outer peripheral edge is higher than that of the fifth example (at least higher than a lower end face of an extracting electrode 102). That is, the anode electrode 103 according to the present example has a bowl shape or well shape deeper than that of the fifth example. Since the height of the wall structure formed in the anode electrode 103 sufficiently high, there is almost no possibility that secondary electron 113 comes over the wall structure described above to collide with the insulator 117.

Also by adopting the microscope structure according to the present example, it is possible to prevent generation of gas in a vacuum chamber 105 as with the fifth example described above. The microscope structure according to the present example can also be applied to the second example (FIG. 4).

(7) Seventh Example

Figure 9:
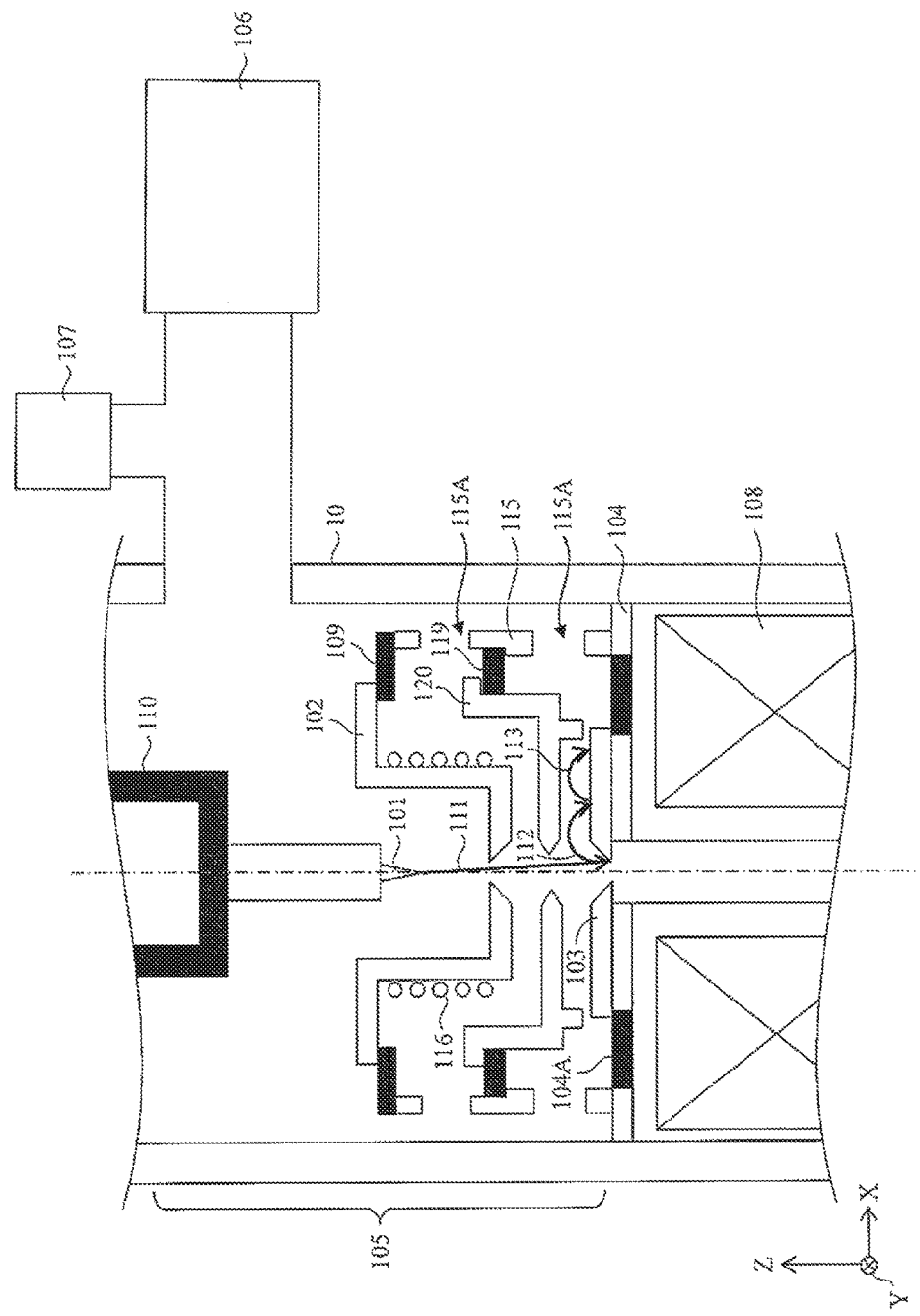
FIG. 9 is a cross-sectional view illustrating a device structure of an electron source according to a seventh example and therearound.

FIG. 9 illustrates a device structure of an electron source and therearound that form a scanning electron microscope according to the present example. In FIG. 9, the parts that correspond to FIG. 1 are given the same reference numerals. A difference between FIG. 9 and FIG. 1 is that, in FIG. 9, a control electrode 120 is provided between an extracting electrode 102 and an anode electrode 103. The control electrode 120 is a member provided for the purpose of adjusting so that a light source position of primary electron beam 111 is not changed by lens function of the extracting electrode 102 and the anode electrode 103 (so that the light source position is kept constant) to improve control accuracy of the electron optical system.

However, gas is discharged by collision of electron generated by collision of the primary electron beam 111 passing the extracting electrode 102 with the control electrode 120 and/or electron generated by re-collision of the electron that has collided with the control electrode 120 with a component in an electron gun with the insulator.

Then a structure for preventing collision of discharge electron with the insulator is adopted for the control electrode 120. One structure is for preventing collision of discharge electron with an insulator 119 for attaching the control electrode 120. As this structure, the control electrode 120 according to the present example adopts a structure similar to that of the anode electrode 103 illustrated in FIG. 8. That is, a structure in which the control electrode 120 is formed as a bowl-shaped or deep plate-shaped electrode with a diaphragm formed at the center of the bottom thereof and is connected to the insulator 119 at an outer face near an upper edge of the wall structure projecting upward from the upper face of the control electrode 120 so as to extend along the outer peripheral edge is adopted. Note that, the insulator 119 is fixed to a cylinder 115 that is attached to an insulating flange 104. Also here, the insulator 119 is attached to a position lower than a side cave 115A so as not to close the side cave 115A formed in the cylinder 115.

Another structure is a structure in which collision of secondary electron 113 emitted from the anode electrode 103 with an insulator 104A is prevented. As this structure, a structure in which a member with a skirt shape projecting downward from the lower face so as to extend along the outer peripheral edge of the control electrode 120 is provided to the control electrode 120 according to the present example is adopted. However, the structure illustrated in FIG. 6 or the structure illustrated in FIG. 7 may be adopted for the anode electrode 103 instead of providing a member with a skirt shape to the control electrode 120.

As described above, it is possible to effectively prevent generation of gas 114 in a vacuum chamber 105 by adopting a structure in which the secondary electron 113 does not collide with the insulators 119 and 104A as in the present example even when the control electrode 120 is provided between the extracting electrode 102 and the anode electrode 103. Note that, an example of a structure of the control electrode 120 illustrated in FIG. 9 is merely an example, and any structure is acceptable in so far as it is a structure in which the secondary electron 113 does not collide with the insulator 104A or the insulator 119. The microscope structure according to the present example can also be applied to the second example (FIG. 4).

(8) Eighth Example

Figure 10:
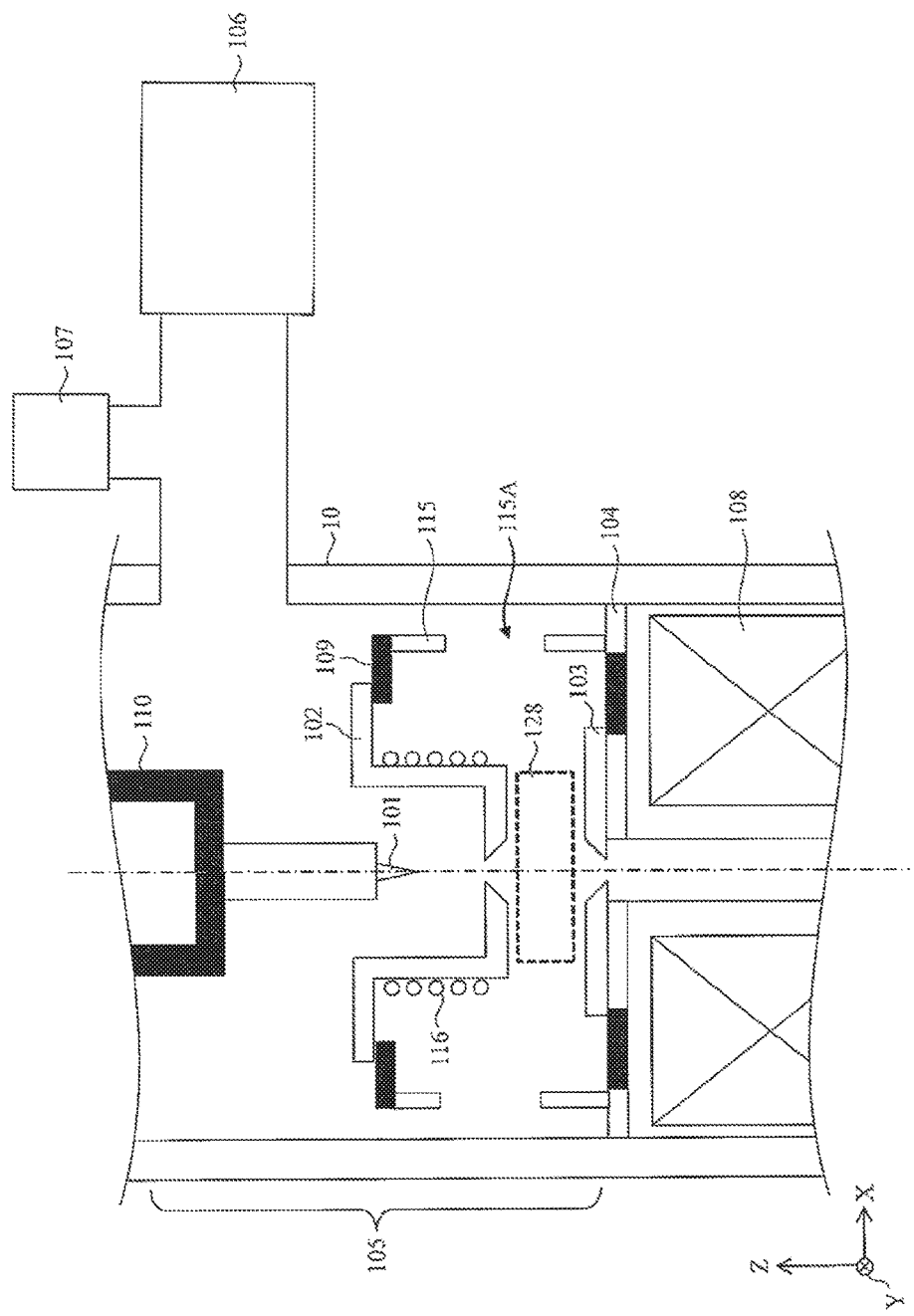
FIG. 10 is a cross-sectional view illustrating a device structure of an electron source according to an eighth example and therearound.

FIG. 10 illustrates a device structure of an electron source and therearound that form a scanning electron microscope according to the present example. In FIG. 10, the parts that correspond to FIG. 1 are given the same reference numerals. A difference between FIG. 10 and FIG. 1 is that, in FIG. 10, a monochrome meter unit 128 is provided between an extracting electrode 102 and an anode electrode 103. The structure of monochrome meter unit 128 may be any structure in so far as energy width of primary electron beam 111 emitted from an electron source 101 is reduced.

Energy width can further be reduced by combination of a CFE electron source and the monochrome meter unit 128 as with the effect of reduction of energy width by switching an SE electron source with a CFE electron source. For example, it is possible to obtain an image with much higher resolution than that in the examples described above by low accelerating voltage of 1 kV or less, for example. Note that, the monochrome meter unit 128 may also include an insulating member (insulator). Then, various structures described in other examples described above are adopted to prevent collision of secondary-generated discharge electron with an insulating member inside the monochrome meter unit 128.

According to the present example, it is possible to obtain an image with high resolution by accelerating voltage much lower than that in the examples described above. The microscope structure according to the present example can also be applied to the second example (FIG. 4).

(9) Other Examples

The present invention is not limited to configurations of the examples described above, but includes various modifications. For example, the example described above describes one or more of examples in detail in order to clearly describe the present invention, and some of the components that are described may not necessarily included. In addition, a part of an example can be replaced by a configuration of another example, and a configuration of another example can be added to a configuration of one example. In addition, another configuration can be added to a configuration of each example, one or more configurations of each example can be replaced by other configurations, and one or more configurations of each example can be removed. In addition, control line and information line show those that are deemed necessary for description, but not all control lines and information lines necessary for achieving a product are shown. Actually, it should be understood that almost all configurations are connected to one another.

REFERENCE SIGNS LIST 10 lens tube (column)
11 attenuation characteristics curve (comparative example 1)
12 attenuation characteristics curve (comparative example 2)
13 attenuation characteristics curve (example 1)
101 electron source
102 extracting electrode
103 anode electrode
104 insulating flange
104A insulator
105 vacuum chamber
105A vacuum chamber
105B vacuum chamber
106 main vacuum pump
106A main vacuum pump
107 sub vacuum pump
107A sub vacuum pump
108 condenser lens
109 insulator
110 insulator
111 primary electron beam
112 secondary electron (secondary electron or reflected electron)
113 secondary electron (electron after re-collision)
114 gas
115 cylinder
115A side cave
116 heating heater
117 insulator 118 insulating flange
119 insulator
120 control electrode

The invention claimed is:

1. A scanning electron microscope comprising:
a CFE (cold field-emission) electron source;
an extracting electrode for extracting an electron from the CFE electron source;
an anode electrode with positive (+) potential for accelerating the electron and outputting the electron to an optical system located at a downstream side;
a first insulator for separating the anode electrode from ground potential;
a single vacuum chamber including both the CFE electron source and the anode electrode;
an ion pump connected to the vacuum chamber;
a NEG (non-evaporative getter) pump connected to the vacuum chamber;
a lens tube for housing the CFE electron source, the extracting electrode, the anode electrode, the first insulator, the vacuum chamber, the ion pump, and the NEG pump; and
a sample chamber connected to the lens tube;
a second insulator for separating the extracting electrode from ground potential; and
a cylindrical attaching member with at least one side cave for connecting an inner space and an outer space of the attaching member to a cylindrical part with an outer diameter smaller than an inner diameter of the lens tube, the attaching member fixing the extracting electrode to the lens tube via the second insulator and housing the anode electrode and the extracting electrode therein.

2. The scanning electron microscope according to claim 1, wherein
a space where the anode electrode is located is connected to a space where the electron source is located via the side cave formed in the attaching member and a connecting path formed between the cylindrical part of the attaching member and the lens tube.

3. The scanning electron microscope according to claim 1, wherein the CFE electron source is any of a tungsten single crystal chip, a nanochip, a carbon nanotube chip, and a superconductive chip.

4. The scanning electron microscope according to claim 1, wherein the first insulator is made of ceramics or engineering plastic.

5. The scanning electron microscope according to claim 1, wherein
the first insulator is arranged such that a second electron, discharged when the electron passing through the extracting electrode collides with the anode electrode, and a third electron, discharged when the second electron re-collides with the anode electrode or an inner wall of the vacuum chamber, do not collide with the first insulator.

6. The scanning electron microscope according to claim 1, wherein
the anode electrode has a structure for preventing at least one of a second electron, discharged when the electron passing through the extracting electrode collides with the anode electrode, and a third electron, discharged when the second electron re-collides with the anode electrode or an inner wall of the vacuum chamber, from colliding with the first insulator.

7. The scanning electron microscope according to claim 1, further comprising a heating heater that can temporarily selectively heat the extracting electrode.

8. The scanning electron microscope according to claim 1, further comprising:
a control electrode provided between the extracting electrode and the anode electrode; and
a third insulator for separating the control electrode from ground potential, wherein
the third insulator is arranged such that a second electron, discharged when the electron passing through the extracting electrode collides with the control electrode, and a third electron, discharged when the second electron re-collides with at least one of the extracting electrode, the anode electrode, and an inner wall of the vacuum chamber, do not collide with the third insulator.

9. The scanning electron microscope according to claim 1, further comprising:
a control electrode provided between the extracting electrode and the anode electrode; and
a third insulator for separating the control electrode from ground potential, wherein
the control electrode has a structure for preventing at least one of a second electron, discharged when the electron passing through the extracting electrode collides with the control electrode, and a third electron, discharged when the second electron re-collides with at least one of the extracting electrode, the anode electrode, and an inner wall of the vacuum chamber, from colliding with the third insulator.

10. The scanning electron microscope according to claim 1, further comprising a monochromator that is provided between the extracting electrode and the anode electrode.

11. A scanning electron microscope comprising:
a CFE (cold field-emission) electron source;
an extracting electrode for extracting an electron from the CFE electron source;
a first vacuum chamber located at an upstream side with respect to the extracting electrode for housing the electron source;
an anode electrode with positive (+) potential for accelerating the electron and outputting the electron to an optical system located at a downstream side;
a first insulator for separating the anode electrode from ground potential;
a second vacuum chamber located at a downstream side with respect to the extracting electrode and for housing the anode electrode;
a first ion pump connected to the first vacuum chamber;
a first NEG (non-evaporative getter) pump connected to the first vacuum chamber;
a second ion pump connected to the second vacuum chamber;
a second NEG (non-evaporative getter) pump connected to the second vacuum chamber;
a lens tube for housing the CFE electron source, the extracting electrode, the first vacuum chamber, the anode electrode, the first insulator, the second vacuum chamber, the first and second ion pumps, and the first and second NEG pumps;
a sample chamber connected to the lens tube;
a second insulator for separating the extracting electrode from ground potential, one end of the second insulator being directly fixed at a lower surface and an end surface thereof to an inner wall of the lens tube and another end of the second insulator being fixed at an upper surface thereof to a lower surface of the extracting electrode.

12. The scanning electron microscope according to claim 11, wherein the CFE electron source is any of a tungsten single crystal chip, a nanochip, a carbon nanotube chip, and a superconductive chip.

13. The scanning electron microscope according to claim 11, wherein the first insulator is made of ceramics or engineering plastic.

14. The scanning electron microscope according to claim 11, wherein
the first insulator is arranged such that a second electron, discharged when the electron passing through the extracting electrode collides with the anode electrode, and a third electron, discharged when the second electron re-collides with the anode electrode or an inner wall of the vacuum chamber, do not collide with the first insulator.

15. The scanning electron microscope according to claim 11, wherein
the anode electrode has a structure for preventing at least one of a second electron, discharged when the electron passing through the extracting electrode collides with the anode electrode, and a third electron, discharged when the second electron re-collides with the anode electrode or an inner wall of the vacuum chamber, from colliding with the first insulator.

16. The scanning electron microscope according to claim 11 further comprising a heating heater that can temporarily selectively heat the extracting electrode.

17. The scanning electron microscope according to claim 11, further comprising:
a control electrode provided between the extracting electrode and the anode electrode; and
a third insulator for separating the control electrode from ground potential, wherein
the third insulator is arranged such that a second electron, discharged when the electron passing through the extracting electrode collides with the control electrode, and a third electron, discharged when the second electron re-collides with at least one of the extracting electrode, the anode electrode, and an inner wall of the vacuum chamber, do not collide with the third insulator.

18. The scanning electron microscope according to claim 11, further comprising:
a control electrode provided between the extracting electrode and the anode electrode; and
a third insulator for separating the control electrode from ground potential, wherein
the control electrode has a structure for preventing at least one of a second electron, discharged when the electron passing through the extracting electrode collides with the control electrode, and a third electron, discharged when the second electron re-collides with at least one of the extracting electrode, the anode electrode, and an inner wall of the vacuum chamber, from colliding with the third insulator.

19. The scanning electron microscope according to claim 11, further comprising a monochromator that is provided between the extracting electrode and the anode electrode.

* * * * *